(12) United States Patent
Tombs et al.

(10) Patent No.: US 8,512,933 B2
(45) Date of Patent: *Aug. 20, 2013

(54) METHOD OF PRODUCING ELECTRONIC CIRCUIT BOARDS USING ELECTROPHOTOGRAPHY

(75) Inventors: Thomas N. Tombs, Rochester, NY (US); Donald S. Rimai, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 962 days.

This patent is subject to a terminal disclaimer.

(21) Appl. No.: 12/341,099

(22) Filed: Dec. 22, 2008

(65) Prior Publication Data

US 2010/0159373 A1   Jun. 24, 2010

(51) Int. Cl.
*G03G 13/22* (2006.01)

(52) U.S. Cl.
USPC .............. 430/120.2; 430/124.13; 430/124.21; 430/126.1

(58) Field of Classification Search
USPC ................... 430/120.2, 120.4, 124.13, 126.1, 430/124.21, 124.23
See application file for complete search history.

(56) References Cited

U.S. PATENT DOCUMENTS

| | | | |
|---|---|---|---|
| 3,997,344 A * | 12/1976 | Schlesinger et al. | 430/144 |
| 6,754,949 B2 * | 6/2004 | Ishii | 29/739 |
| 6,872,500 B2 | 3/2005 | Burberry et al. | |
| 6,893,790 B2 | 5/2005 | Lelental et al. | |
| 7,033,713 B2 | 4/2006 | Lelental et al. | |
| 7,051,429 B2 | 5/2006 | Kerr et al. | |
| 7,163,734 B2 | 1/2007 | Anderson et al. | |
| 7,232,608 B2 | 6/2007 | Fujihara et al. | |
| 2004/0197487 A1 | 10/2004 | Aoki et al. | |
| 2005/0153249 A1 | 7/2005 | Yamaguchi et al. | |
| 2006/0071084 A1 | 4/2006 | Detig et al. | |
| 2007/0218258 A1 * | 9/2007 | Nees et al. | 428/209 |
| 2008/0050132 A1 | 2/2008 | Boness et al. | |
| 2009/0145548 A1 * | 6/2009 | Ho et al. | 156/277 |

OTHER PUBLICATIONS

Donald S. Rimai, David S. Weiss, M. Cristina de Jesus and David J. Quesnel, Article in Press, "Electrophotography as a means of microfabrication: the role of electrodynamic and electrostatic forces", 2005. , Comptes Rendus Chimie, Elsevier SAS, pp. 1-10.

* cited by examiner

*Primary Examiner* — Janis L Dote
(74) *Attorney, Agent, or Firm* — Christopher J. White; Peyton C. Watkins

(57) ABSTRACT

The present invention provides a method producing printed electronic circuits using electrophotography.

4 Claims, 3 Drawing Sheets

METHOD OF PRODUCING ELECTRONIC CIRCUIT BOARDS USING ELECTROPHOTOGRAPHY

CROSS REFERENCE TO RELATED APPLICATIONS

This application relates to commonly assigned, co-pending U.S. application Ser. No. 12/341,136, filed Dec. 22, 2008, entitled: "ELECTROPHOTOGRAPH PRINTED ELECTRONIC CIRCUIT BOARDS", and U.S. application Ser. No. 12/341,182, filed Dec. 22, 2008, entitled: "PRINTED ELECTRONIC CIRCUIT BOARDS AND OTHER ARTICLES HAVING PATTERNED CONDUCTIVE IMAGES".

FIELD OF THE INVENTION

The present invention is directed generally to printing electronic circuits, and more particularly, to producing printed electronic circuits using electrophotography.

BACKGROUND OF THE INVENTION

A printed circuit board is used to mechanically support and electrically connect electronic components using conductive pathways, or traces, etched from copper sheets laminated onto a non-conductive substrate. They may also be referred to as printed wiring board or etched wiring board. A printed circuit populated with electronic components is a printed circuit assembly, also known as a printed circuit board assembly.

Printed circuits are rugged, inexpensive, and can be highly reliable. They require much more layout effort and higher initial cost than either wire-wrapped or point-to-point constructed circuits, but are much cheaper and faster for high-volume production. Conducting layers are typically made of thin copper foil. Insulating layers are typically laminated together with epoxy resin. The board is typically green in color and made of materials like polytetrafluoroethylene, FR-4, FR-1, CEM-1 or CEM-3. Well known prepreg materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester).

Most printed circuit boards are made by bonding a layer of copper over the entire substrate, sometimes on both sides, (creating a "blank PCB") then removing unwanted copper after applying a temporary mask (e.g. by etching), leaving only the desired copper traces. A few PCBs are made by adding traces to the bare substrate (or a substrate with a very thin layer of copper) usually by a complex process of multiple electroplating steps.

There are three common "subtractive" methods (methods that remove copper) used for the production of printed circuit boards:

Silk screen printing uses etch-resistant inks to protect the copper foil. Subsequent etching removes the unwanted copper. Alternatively, the ink may be conductive, printed on a blank (non-conductive) board. The latter technique is also used in the manufacture of hybrid circuits.

Photoengraving uses a photomask and chemical etching to remove the copper foil from the substrate. The photomask is usually prepared with a photoplotter from data produced by a technician using CAM, or computer-aided manufacturing software. Laser-printed transparencies are typically employed for phototools; however, direct laser imaging techniques are being employed to replace phototools for high-resolution requirements.

PCB milling uses a two or three-axis mechanical milling system to mill away the copper foil from the substrate. A PCB milling machine (referred to as a 'PCB Prototyper') operates in a similar way to a plotter, receiving commands from the host software that control the position of the milling head in the x, y, and (if relevant) z axis. Data to drive the Prototyper is extracted from files generated in PCB design software and stored in HPGL or Gerber file format.

"Additive" processes also exist. The most common is the "semi-additive" process. In this version, the unpatterned board has a thin layer of copper already on it. A reverse mask is then applied. (Unlike a subtractive process mask, this mask exposes those parts of the substrate that will eventually become the traces.) Additional copper is then plated onto the board in the unmasked areas; copper may be plated to any desired weight. Tin-lead or other surface platings are then applied. The mask is stripped away and a brief etching step removes the now-exposed original copper laminate from the board, isolating the individual traces.

The additive process is commonly used for multi-layer boards as it facilitates the plating-through of the holes (to produce conductive bias) in the circuit board.

One method for printing images on a receiver member is referred to as electrography. In this method, an electrostatic image is formed on a dielectric member by uniformly charging the dielectric member and then discharging selected areas of the uniform charge to yield an image-wise electrostatic charge pattern. Such discharge is typically accomplished by exposing the uniformly charged dielectric member to actinic radiation provided by selectively activating particular light sources in an LED array or a laser device directed at the dielectric member. After the image-wise charge pattern is formed, the pigmented (or in some instances, non-pigmented) marking particles are given a charge, substantially opposite the charge pattern on the dielectric member and brought into the vicinity of the dielectric member so as to be attracted to the image-wise charge pattern to develop such pattern into a visible image.

Thereafter, a suitable receiver member (e.g., a cut sheet of plain bond paper) is brought into juxtaposition with the marking particle developed image-wise charge pattern on the dielectric member. A suitable electric field is applied to transfer the marking particles to the receiver member in the image-wise pattern to form the desired print image on the receiver member. The receiver member is then removed from its operative association with the dielectric member and the marking particle print image is permanently fixed to the receiver member typically using heat, and/or pressure and heat. Multiple layers or marking materials can be overlaid on one receiver, for example, layers of different color particles can be overlaid on one receiver member to form a multi-color print image on the receiver member after fixing.

Metal films, such as aluminum and gold, are commonly used in the manufacture of metal coated printed articles and electrical circuits in the commercial printing business. Currently there are commercial devices that stamp metal films, including a wide variety of reflective and electrically conductive thin films on various substrates.

There is a critical need in the art for a technique to create patterned conductive structures in a cost effective manner for short runs or with variable information. In addition to providing superior electrode performance, these conductive layers also must be digitally patterned, must resist the effects of humidity change, and be manufacturable at a reasonable cost.

It is toward the objective of providing both such improved electrically conductive, digitally patterned articles that more effectively meet the diverse commercial needs than those of the prior art, that the present invention is directed.

The printed circuits of the present invention are patterned by application of one of more toners using the electrographic development process. The final pattern is "fixed" by means of pressure and (or) heat fixing step, whereupon the toner particles interacts with a conductive powder to adhere the conductive powder to a substrate.

SUMMARY OF THE INVENTION

The present invention is related to methods for printing a circuit onto a substrate using electrophotography.

One embodiment of the present invention contemplates a method for producing a printed circuit including the steps of image-wise producing a pattern comprising a thermoplastic on a substrate, depositing conductive powder over the substrate, permanently fixing the conductive powder on the thermoplastic substrate, removing the conductive powder from portions of the substrate other than that coated with the thermoplastic pattern.

Another embodiment of the present invention contemplates a method for producing a printed circuit including the steps of charging a primary imaging member; creating an electrostatic latent image by image-wise exposing the primary imaging member, image-wise depositing thermoplastic particles onto the primary imaging member, transferring the thermoplastic particles to an electrically insulating substrate, permanently fixing the thermoplastic particles, depositing conductive powder over the substrate, permanently fixing the conductive powder on the thermoplastic substrate, and removing conductive powder from portions of the substrate other than that coated with the thermoplastic pattern.

A further embodiment of the present invention contemplates a method for producing a printed circuit including the steps of charging a primary imaging member, creating an electrostatic latent image by image-wise exposing the primary imaging member, image-wise depositing thermoplastic particles onto the primary imaging member, transferring the thermoplastic particles to an electrically insulating substrate, permanently fixing the thermoplastic particles, depositing conductive powder over the substrate, permanently fixing the conductive powder on the thermoplastic substrate, removing conductive powder from portions of the substrate other than that coated with the thermoplastic pattern, and driving the conductive particles into the thermoplastic by applying heat and/or pressure.

Another embodiment of the present invention contemplates a method of producing a multilayer printed circuit including the steps of charging a primary imaging member, create an electrostatic latent image by image-wise exposing the primary imaging member, image-wise depositing thermoplastic particles onto the primary imaging member, transferring the thermoplastic particles to an electrically insulating substrate, fixing the thermoplastic particles to form a first thermoplastic image, depositing metallic powder over the substrate, fixing the metallic powder on the first thermoplastic image, removing metallic powder from portions of the substrate other than that coated with the thermoplastic pattern, depositing a second image of electrically-insulating thermoplastic particles uniformly over at least a portion of the substrate or otherwise depositing electrically-insulating thermoplastic particles uniformly over the substrate, cross-linking the thermoplastic particles of the second image so as to render them into a thermoset layer, charging a primary imaging member, creating an electrostatic latent image by image-wise exposing the primary imaging member, image-wise depositing thermoplastic particles onto the primary imaging member, transferring the third image of thermoplastic particles to the thermoset layer in register with the previously transferred metallic particles, fixing the third image of thermoplastic particles, depositing metallic powder over the substrate, fixing the metallic powder on the thermoplastic substrate, and removing metallic powder from portions of the substrate other than that coated with the thermoplastic pattern.

These and other aspects, objects, features and advantages of the present invention will be more clearly understood and appreciated from a review of the following detailed description of the preferred embodiments, the Figures, and appended claims.

DETAILED DESCRIPTION OF THE INVENTION

Figure 1:
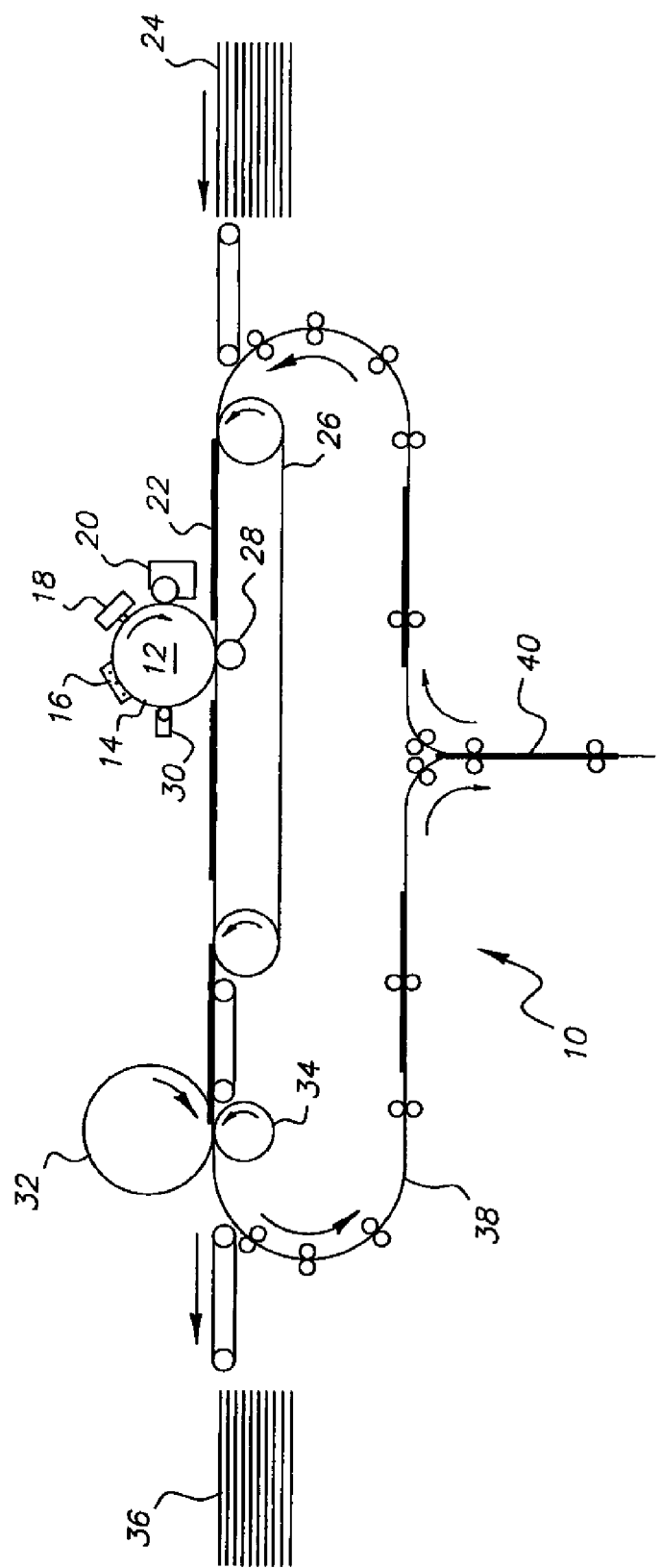
FIG. 1 is a schematic illustration of a side view of an electrographic reproduction apparatus in which the method of the present invention may be used.

For simplicity and illustrative purposes, the principles of the present invention are described by referring to various exemplary embodiments thereof. Although the preferred embodiments of the invention are particularly disclosed herein, one of ordinary skill in the art will readily recognize that the same principles are equally applicable to, and can be implemented in other systems, and that any such variation would be within such modifications that do not part from the scope of the present invention. Before explaining the disclosed embodiments of the present invention in detail, it is to be understood that the invention is not limited in its application to the details of any particular arrangement shown, since the invention is capable of other embodiments. The terminology used herein is for the purpose of description and not of limitation. Further, although certain methods are described with reference to certain steps that are presented herein in certain order, in many instances, these steps may be performed in any order as would be appreciated by one skilled in the art, and the methods are not limited to the particular arrangement of steps disclosed herein.

Standard methods to produce printed circuits such as radio frequency identification devices ("RFIDs"), sensors, flexible displays, etc. do not employ electrophotography technology. The present invention provides an efficient method of making a printed circuit. (e.g. RFID tags)

Methods in accordance with the present invention enable the manufacture of such devices more efficiently and cost effectively than previously known methods. Any standard electrophotography equipment may be utilized in combination with equipment that is made to deposit particles. One example of equipment used to deposit particle is thermographic equipment.

In a preferred mode of practicing this invention, an electrostatic latent image in the pattern of the printed circuit is produced on a primary imaging member comprising a photoreceptor. The electrostatic latent image is then developed into a visible image using a specially prepared conductive powder, described forthwith. The image was then electrostatically transferred, using conventional electrostatic roller transfer, known in the electrophotography art, to a paper receiver. The image was then permanently fixed by exposing the image to solvent vapors e.g., solvent vapors emanating from a sump containing dichloromethane, or by heating the image bearing receiver to a temperature sufficient to fuse the powder to the receiver. If desired, conductivity can be enhanced by forcing the conductive powder particles into even closer proximity to each other by casting the fixed image-bearing receiver against a smooth material such as a polyimide sheet such as Kaptan-H (manufactured by DuPont), using heated rollers in a process known in the art as ferrotyping.

Conductive particle per se are not suitable for use in the aforementioned application. Specifically, particles suitable for use must be able to be electrically charged to a desired level in order to develop the electrostatic latent image and to be transferred from the primary image bearing member to the receiver. This cannot be done with a conductive particle. Conversely, the particles must be highly conductive to be suitable for use in forming printed circuits. This is done by coating the conductive particles with a thermoplastic, electrically insulating polymer with a coating that is sufficient to prevent or at least substantially reduce discharging, but not so great as to prevent contact between the conductive particles in the fused image. This can be accomplished by blending an amount of conducting powder with an amount of polymer in a ratio by weight of between 0.7 and 3.0 times the ratio of the mass densities of the polymer and material comprising the conducting powder. Suitable conducting powders include silver, gold, stainless steel, copper, carbon, and aluminum. Suitable polymers include thermoplastics, preferably with a glass transition temperature between 50° C. and 70° C. Suitable materials include polyester, polystyrene, polyester amides, polycarbonates, etc.

As an example, the conducting powder used in this study was prepared by first dissolving 4 g of polyester granules (mass density=1.2 g/cm$^3$) in 60 ml of dichloromethane. After dissolving the polyester, 60 g of silver powder (sold by DuPont (mass density=10.5 g/cm$^3$) was added, for a conducting powder to polymer ratio of 15. The ratio of the density of the silver to polyester was 8.75, resulting in a blend of materials within the aforementioned limits. The dispersion was then allowed to thoroughly dry, after which the materials was ground into a fine powder in a mortar and pestle. Other means of preparing suitable materials include compounding and grinding, and chemical means such as evaporative limited coalescence, as well as other means known in the literature. It should be noted that the concentration of the conducting powder to powder is much higher for this application than for normal electrophotographic printing applications and would not be suitable for such printing applications. Conversely, the carbon concentration in black pigment, for example, is much too low to be suitable for the present application.

It should be noted that the size of the composite particles comprising the polymer and conductive powder, hereafter referred to as "toner" is not critical. However, there are several constraints that need to be taken into account when preparing the toner. Toner particles preferably should be greater than approximately 2 μm if dry electrophotographic printing is used to make the image. However, smaller particles can be used if wet electrophotographic development, whereby the toner is dispersed in a carrier fluid such as ISOPAR G. Maximum size of the toner is restricted by the fineness of the wires to be produced. For example, if it is desired to produce 1 mil wires (i.e. 25 μm) the toner particles should preferably be less than 8 μm in diameter to ensure that there are sufficient particles to ensure good interparticle contact. To avoid formation of satellites that can bridge wires, it is generally undesirable to have toner particles having diameters greater than approximately 20 μm.

First an electrode pattern for 1 or more circuits are printed with toner using a standard electrostatographic process known in the industry, preferably dry electrophotography Electrostatographic reproduction apparatus generally are well known. Therefore the present description will be directed in particular to elements forming part of, or cooperating more directly with the present invention. There exist many different embodiments of the electrographic image forming process used in such reproduction apparatus. This description will use three examples to teach the present invention, but it must be understood that the present invention is not limited to these examples, but rather could be practiced in any embodiment with the same image forming steps.

With reference to the electrographic reproduction apparatus 10 as shown in FIG. 1, an imaging drum 12 is provided on which is coated a photoconductive member 14. The imaging drum 12 is selectively rotated, by any well-known drive mechanism (not shown), in the direction indicated by the arrow, to advance the photoconductive member 14 past a series of subsystems of the electrographic reproduction apparatus. A primary charging device 16 is provided to deposit a uniform electrostatic charge onto the photoconductive member 14. The uniform charge on the photoconductive member 14 is subsequently selectively dissipated by, for example, a digitally addressed exposure subsystem 18, such as a Light Emitting Diode (LED) array or a scanned laser, to form an electrostatic latent image of a document to be reproduced. The electrostatic latent image is then rendered visible by development subsystem 20, which deposits charged, pigmented marking particles onto the photoconductive member 14 in accordance with the electrostatic charge pattern of the latent image. The developed marking particle image is then transferred to a receiver member 22 that has been fed from supply 24 onto the transport belt 26. The electric field to transfer the marking particle image from the photoconductive member 14 to the receiver member 22 is provided by electrically biased roller 28. Cleaner 30 cleans any marking particles that are not transferred from the photoconductive member 14 to the receiver member 22. The receiver member 22 bearing the marking particle image is then transported through the nip formed between fuser roller 32 and pressure roller 34 wherein the marking particle image is fused by heat and pressure to the receiver member 22.

The fuser roller 32 is heated to a temperature high enough to fuse the marking particle image to the receiver member 22 as the receiver member 22 is passed through the nip with the side bearing the marking particle image in contact with the fuser roller 32. After exiting the fuser nip, if the print job calls for an image on just side one of the receiver member 22, the receiver member 22 is transported to output stack 36. If the print job calls also for an image on side two (the reverse side) of the receiver member 22, hereafter referred to as duplex printing, the receiver member 22 is not transported to the output stack 36, but rather is diverted to return path 38. In return path 38, the receiver member 22 is turned over in turnover device 40 and then returned to transport belt 26 whereupon a second marking particle image is transferred to side two of receiver member 22. The receiver member 22 bearing the marking particle image on side two is then transported through the nip formed between fuser roller 32 and pressure roller 34 wherein the marking particle image on side two of the receiver member 22 is fused by heat and pressure to side two of the receiver member 22. After exiting the fuser nip the receiver member, with images on both sides, is transported to output stack 36.

Figure 2:
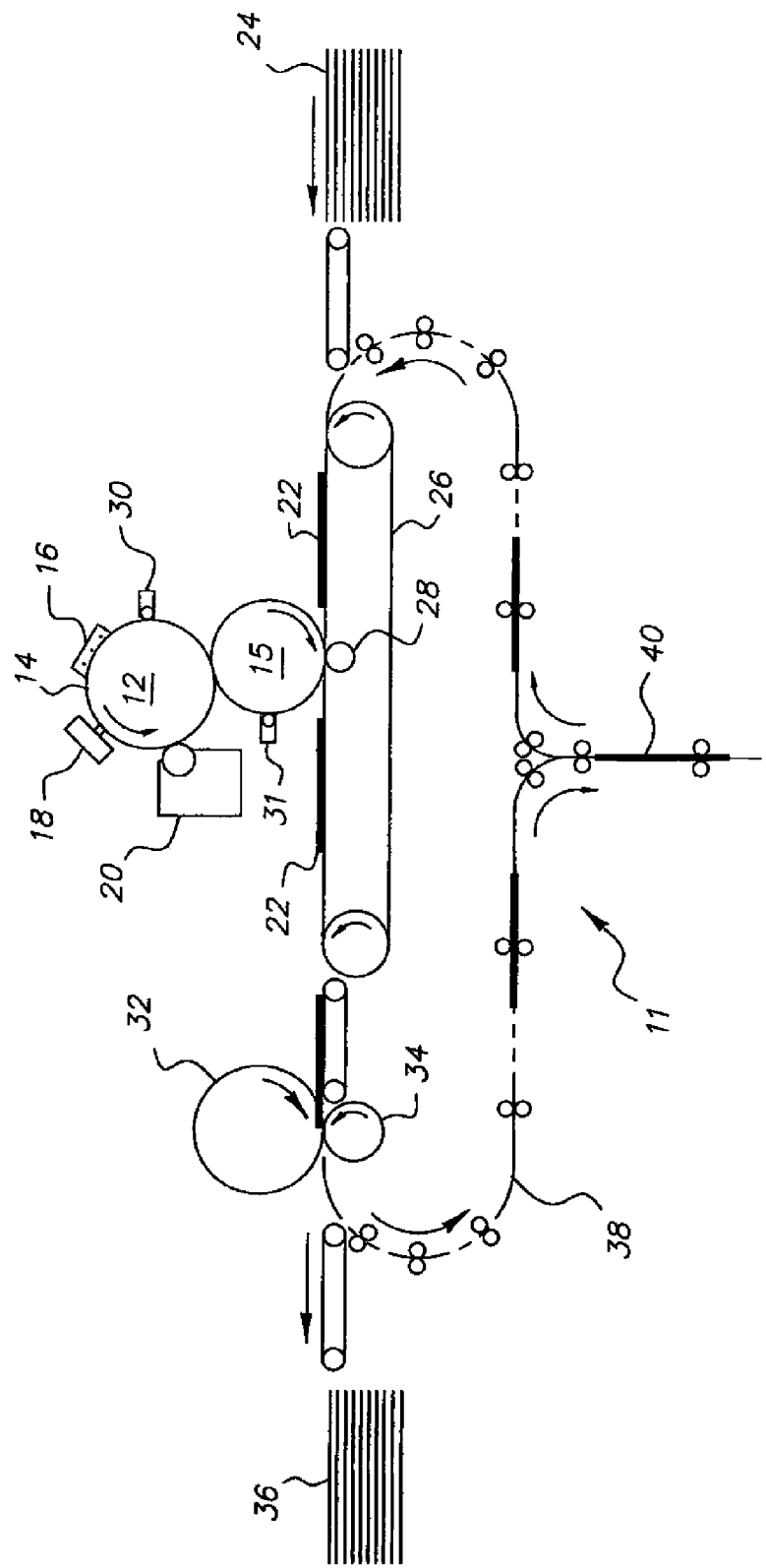
FIG. 2 is a schematic illustration of a side view of an alternate electrographic reproduction apparatus in which the method of the present invention may be used.

FIG. 2 illustrates a variation of the electrographic reproduction apparatus in FIG. 1. In the variation illustrated in FIG. 2 the marking particle image formed on the photoconductor element is first transferred to an intermediate transfer element and then from the intermediate transfer element to the receiver element. All elements that are common to the two electrographic reproduction apparatus illustrated in FIG. 1 and FIG. 2 employ the same reference numerals. With reference to the electrographic reproduction apparatus 11 as shown in FIG. 2, an imaging drum 12 is provided on which is coated a photoconductive member 14. The imaging drum 12 is selectively rotated, by any well-known drive mechanism (not shown), in the direction indicated by the arrow, to advance the photoconductive member 14 past a series of subsystems of the electrographic reproduction apparatus. A primary charging device 16 is provided to deposit a uniform electrostatic charge onto the photoconductive member 14. The uniform charge on the photoconductive member 14 is subsequently selectively dissipated by, for example, a digitally addressed exposure subsystem 18, such as a Light Emitting Diode (LED) array or a scanned laser, to form an electrostatic latent image of a document to be reproduced.

The electrostatic latent image is then rendered visible by development subsystem 20, which deposits charged, pigmented marking particles onto the photoconductive member 14 in accordance with the electrostatic charge pattern of the latent image. The developed marking particle image is then transferred from photoconductive member 14 to intermediate transfer member 15. The electric field to transfer the marking particle image from photoconductive member 14 to intermediate transfer member 15 is provided by an appropriate bias voltage applied to intermediate transfer member 15. Cleaner 30 cleans any marking particles that are not transferred from the photoconductive member 14 to the intermediate transfer member 15. The marking particle image is then transferred from intermediate transfer member 15 to a receiver member 22 that has been fed from supply 24 onto the transport belt 26. The electric field to transfer the marking particle image from the intermediate transfer member 15 to the receiver member 22 is provided by electrically biased roller 28. Cleaner 31 cleans any marking particles that are not transferred from intermediate transfer member 15 to the receiver member 22. The receiver member 22 bearing the marking particle image is then transported through the nip formed between fuser roller 32 and pressure roller 34 wherein the marking particle image is fused by heat and pressure to the receiver member 22.

The fuser roller 32 is heated to a temperature high enough to fuse the marking particle image to the receiver member 22 as the receiver member 22 is passed through the nip with the side bearing the marking particle image in contact with the fuser roller 32. After exiting the fuser nip, if the print job calls for an image on just side one of the receiver member 22, the receiver member is transported to output stack 36. If the print job calls also for an image on side two of the receiver member 22, hereafter referred to as duplex printing, the receiver member 22 is not transported to the output stack 36, but rather is diverted to return path 38. In return path 38 the receiver member 22 is turned over in turnover device 40 and returned to transport belt 26 whereupon a second marking particle image is transferred to side two of receiver member 22. The receiver member 22 bearing the marking particle image on side two is then transported through the nip formed between fuser roller 32 and pressure roller 34 wherein the marking particle image on side two of the receiver member 22 is fused by heat and pressure to side two of the receiver member 22. After exiting the fuser nip the receiver member, with images on both sides, is transported to output stack 36.

Figure 3:
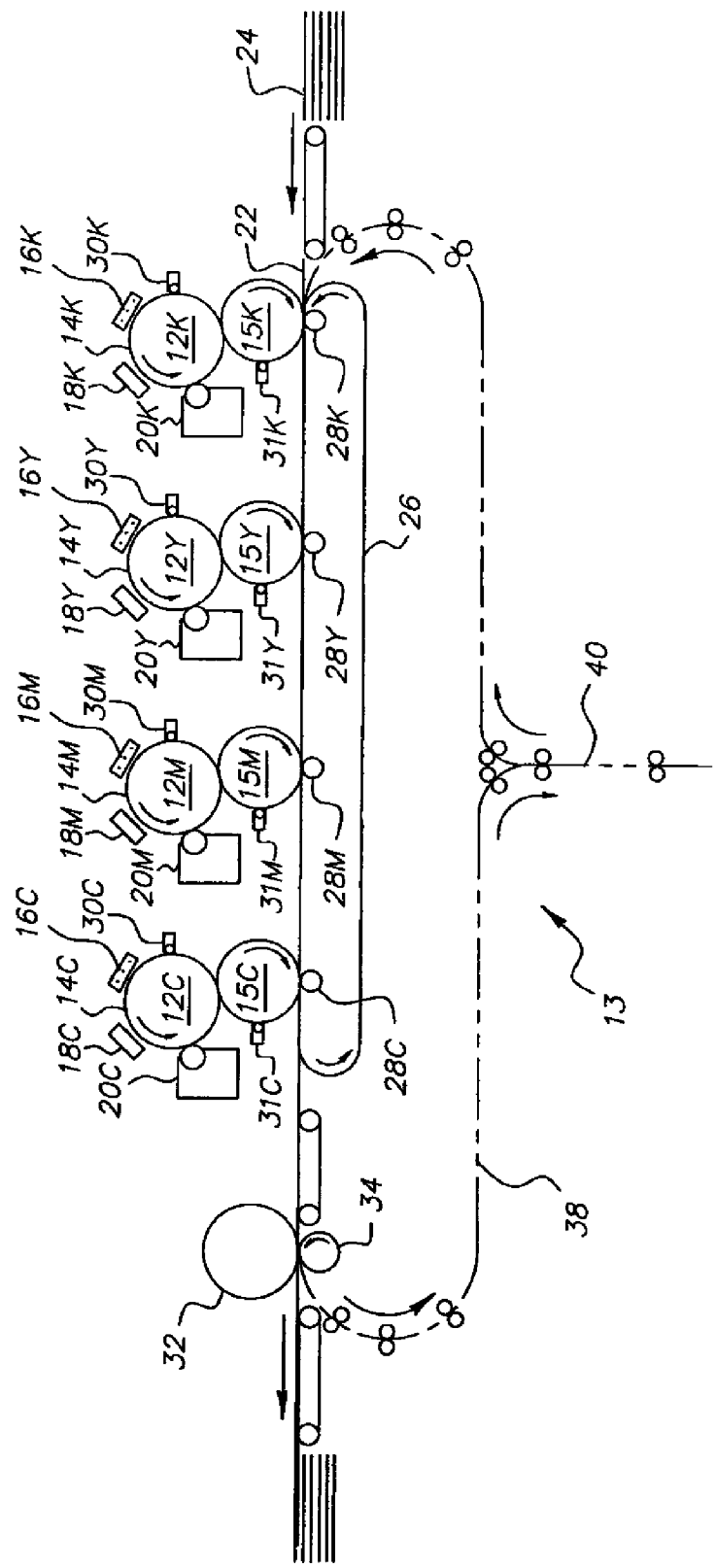
FIG. 3 is a schematic illustration of a side view of an electrographic reproduction apparatus with four imaging modules in which the method of the present invention may be used.

In the electrographic reproduction apparatus 10 and 11 illustrated in FIGS. 1 and 2 respectively, and described above, the combination of elements including the imaging drum 12 on which is coated the photoconductive member 14, the primary charging device 16, the exposure subsystem 18, the development subsystem 20, the electrically biased roller 28, the cleaner 30, (and the intermediate transfer element 15 with cleaner 31 in apparatus 11) will henceforth be referred to as the imaging module. Either electrographic reproduction apparatus, 10 depicted in FIG. 1 or 11 in FIG. 2, could include a plurality of imaging modules in sequence along the length of the transport belt 26 for the purpose of creating and transferring different respective colored marking particle images to the receiver element 22 in superimposed register. FIG. 3 illustrates, for example, a 4-color electrographic reproduction apparatus, generally designated by numeral 13 and corresponding to apparatus 11 in FIG. 2, with imaging modules respectively containing cyan (C), magenta (M), yellow (Y), and black (K) marking particles (of course, other members of modules are suitable for use with this invention). In FIG. 3 individual process elements in the imaging modules corresponding to the same elements in FIG. 2 are designated with the same numeral as in FIG. 2 but with a C, M, Y, or K.

Step one of the process of the present invention utilizes an electrographic method to create a first thermoplastic image. The printed substrate is preferably an insulating and thermally stable material such as polymide but other materials such as PET, fiberglass, and paper are also envisioned. The substrate may contain holes so that the electrical connections to the rear of the substrate could be made.

In step 2 the electrode pattern printed with toner is contacted with conducting particles or powder. Metallic particles such as copper, tin, tin plated copper, or silver particles are preferred, however conducting polymer particles are also envisioned. The conducting particles may have coatings on them to improve conduction between particles. A conductive polymer coating on a metallic particle would facilitate the formation of conductive paths between particles in a subsequent fixing step. Conducting polymers may comprise metal salts or carbon to enhance conduction.

In step 3 heat is applied to fix the conductive particles only to areas where the toned image resides. The heated toner in this step melts and acts as an adhesive to cause the conductive particles to adhere only in areas where the toner resides. When the toner cools the conductive particles becomes securely attached to the substrate. Pressure may also be used in addition to or instead of heat in this step.

Step 4: Conducting particle not adhering to the thermoplastic image are then removed by vacuum, pressurized air, a rotating brush or other means well know by those skilled in the art.

Step 5: the printed substrate may then be optionally printed with another toner pattern using a standard electrostatographic process so that an insulating layer is applied over the conductive electrodes in areas that will not be in contact to subsequently applied circuit elements [see step]. Means to adequately register the first toner image with the second toner image are used as known in the industry. An example of a registration system is described in DE200410051293 filed Oct. 20, 2004 by Jan D. Boness, Ingo K. Dreher, Heiko Hunold, Karlheinz Peter, Stefan Schrader and application US 2008/0050132 filed Aug. 30, 2007, entitled METHOD AND DEVICE FOR CONTROLLING REGISTRATION that are incorporated by reference.

Step 6: The toner used in step 1 and or optional step 5 may be cross linkable. The toner in one or both of the layers may optionally be cross-linked by application of heat (thermal cross-linking) or UV light (UV cross-linking) through the backside of the transparent or semi-transparent printing substrate for toner printed in step 1 and directly for the toner printed in optional step 5.

Circuit elements, such as integrated circuits, resistors, and capacitors, are then adhered to the printed substrate so that the electrodes of the printed electrodes make electrical contact to the appropriate electrodes of the circuit elements using any method known in the industry. Additional steps known in the industry can be used if needed to cut the substrate and, if needed, apply the substrate to a rigid board.

The above methods may also be used for making a multi-layer printed circuit. Steps 1-6 above are used to create each pair of layers of the printed circuit board which may be rigid or flexible in its final state. The substrate is preferably polymide. The substrate may contain holes so that the connections to the rear of the substrate could be made.

At least the second printed toner layer in step 5 is then cross-linked as described above so that it will not become tacky when a second conductive layer is applied.

The previous steps are then repeated for each circuit layer that makes up the multi-layer printed circuit board. Means to adequately register the first pair of layers with the second pair of layers are used as known in the industry.

Circuit elements, such as integrated circuits, resistors, and capacitors are then adhered to the printed substrate so that the electrodes of the printed circuit make electrical contact to the appropriate electrodes of the circuit elements. Additional steps known in the industry are then used to cut the substrate and if needed apply to a rigid board.

In both methods described above the printed substrate can be subsequently printed on the rear surface using the similar steps so that circuit elements can be mounted on both sides of the substrate. Connections between each side can be made by filling holes that are drilled into the substrate either before the substrate is printed or afterward with conducting material.

Example 1

Conducting toner was prepared as described above using silver powder and polyester. The toner was mixed with a ferrite carrier to make a developer and 12 g were loaded onto the shell of a sumpless magnetic electrophotographic development station comprising a core of 20 magnets with alternating poles. An electrostatic latent image comprising lines approximately 0.5 mm across was formed on a photoreceptor and the photoreceptor brought into close proximity with the development station. The developed image was electrostatically transferred to paper and the resulting image fused by exposing to the vapors of dimethyl chloride. The electrical resistance measured between two points approximately 1 inch apart on one of the lines was found to be approximately 100Ω.

Example 2

Similar to example 1 except that the image was fused in an oven. The electrical resistance was similar.

Example 3

This example is similar to example 2 except that, after oven fusing, the circuit was placed on a hot plate and heated to approximately 100° C. A sheet of KAPTON-H was placed over the circuit and the KAPTON-H was then manually pressed against the circuit, thereby ferrotyping it. After cooling, the KAPTON-H and the circuit were separated. The resistivity decreased to a few tens of ohms.

Example 4

In this example, a printed circuit was made by depositing silver powder onto an electrophotographically formed image of the aforementioned pattern. Specifically, and electrophotographic image was formed in the pattern of the circuit using conventional toner. After oven fusing the image, the pattern was then coated with silver powder. The powder was tacked to the pattern using vapors of dichloromethane. Excess silver powder was removed by first holding the circuit on edge and tapping, followed by blowing with compressed air. After tacking, the circuit was ferrotyped, as described above. The resulting resistance was approximately several hundred ohms.

Example 5

This was similar to example 4 except that, after the tacking and removal processes, several additional coating of silver powder were deposited. After each tacking, excess silver was removed, as described above. Finally, after ferrotyping, the resultant resistance was found to be less than 100Ω.

The invention has been described in detail with particular reference to certain preferred embodiments thereof, but it will be understood that variations and modifications can be effected within the spirit and scope of the invention.

What is claimed is:

1. A method for producing a printed circuit comprising:
   charging a primary imaging member;
   creating an electrostatic latent image by image-wise exposing the primary imaging member;
   image-wise depositing thermoplastic particles onto the primary imaging member;
   transferring the thermoplastic particles to an electrically insulating substrate;
   permanently fixing the transferred thermoplastic particles;
   depositing conductive powder over the substrate;
   permanently fixing the conductive powder on the fixed thermoplastic particles;
   removing conductive powder from portions of the substrate other than that coated with the fixed thermoplastic particles; and
   driving the conductive particles into the fixed thermoplastic particles by applying heat and pressure.

2. A method for producing a multilayer printed circuit comprising:
   charging a primary imaging member;
   creating an electrostatic latent image by image-wise exposing the primary imaging member;
   image-wise depositing thermoplastic particles onto the primary imaging member;
   transferring the thermoplastic particles to an electrically insulating substrate;
   permanently fixing the transferred thermoplastic particles;
   depositing conductive powder over the substrate;
   permanently fixing the conductive powder on the fixed thermoplastic particles;
   removing conductive powder from portions of the substrate other than that coated with the fixed thermoplastic particles;

depositing electrically-insulating thermoplastic particles uniformly over the substrate;

cross-linking the thermoplastic particles so as to render them into a thermoset layer;

charging a primary imaging member;

creating an electrostatic latent image by image-wise exposing the primary imaging member;

image-wise depositing thermoplastic particles onto the primary imaging member;

transferring the thermoplastic particles to the thermoset layer in register with the previously non-removed conductive powder;

permanently fixing the thermoplastic particles;

depositing conductive powder over the substrate;

permanently fixing the conductive powder on the fixed thermoplastic particles; and removing conductive powder from portions of the substrate other than that coated with the fixed thermoplastic particles.

3. The method according to claim 2, wherein the conductive powder is permanently fixed by the application of heat.

4. The method according to claim 2, wherein the conductive powder is permanently fixed by the exposure to solvent vapor.

* * * * *